US006362688B1

(12) United States Patent
Au (10) Patent No.: US 6,362,688 B1
(45) Date of Patent: Mar. 26, 2002

(54) SYSTEM AND METHOD FOR OPTIMAL BIASING OF A TELESCOPIC CASCODE OPERATIONAL TRANSCONDUCTANCE AMPLIFIER (OTA)

(75) Inventor: Stephen Au, Mountain View, CA (US)

(73) Assignee: Maxim Integrated Products, Inc., Sunnyvale, CA (US)

(*) Notice: Subject to any disclaimer, the term of this patent is extended or adjusted under 35 U.S.C. 154(b) by 0 days.

(21) Appl. No.: 09/559,246

(22) Filed: Apr. 26, 2000

(51) Int. Cl.[7] .............................. H03F 3/45; G05F 3/16
(52) U.S. Cl. ....................... 330/261; 330/253; 323/313; 323/314
(58) Field of Search ................................ 330/253, 261; 323/313, 314

(56) References Cited

U.S. PATENT DOCUMENTS

| 4,282,477 | A | * | 8/1981 | Ahmed | 323/312 |
| 4,882,761 | A | * | 11/1989 | Waldhauer | 381/106 |
| 4,987,379 | A | * | 1/1991 | Hughes | 330/253 |
| 5,352,973 | A | * | 10/1994 | Audy | 330/256 |
| 5,446,412 | A | | 8/1995 | Kimyacioglu et al. | |
| 5,847,607 | A | | 12/1998 | Lewicki et al. | |

FOREIGN PATENT DOCUMENTS

WO    WO 95/30271    4/1995

OTHER PUBLICATIONS

"Designing Operational Transconductance Amplifiers For Low Voltage Operation," by P.J. Crawley et al., McGill University, 1993 IEEE International Symposium on Circuits And Systems, vol. 2 of 4, pp. 1455–1458.

* cited by examiner

Primary Examiner—Robert Pascal
Assistant Examiner—Patricia T. Nguyen
(74) Attorney, Agent, or Firm—Blakely, Sokoloff, Taylor & Zafman LLP (57) ABSTRACT

A system and method of biasing a telescopic cascode operational transconductance amplifier is provided to prevent or reduce the likelihood that the inputs to the amplifier do exceed the input common mode voltage range for the amplifier. The system and method provides a bias control circuit for the differential input transistors and tail current transistor of the operational amplifier such that their respective Vds–Vdsat is maintained substantially constant. To accomplish this, the biasing system and method uses a bandgap voltage source that typically produces a highly stable voltage that is substantially temperature and process invariant. The bandgap voltage source is used to generate bias voltages applied to the gates and drains of the differential input transistors that maintains their and the tail current transistor's Vds–Vdsat substantially constant. There are several advantages of the system and method for biasing a telescopic cascode OTA. First, by keeping Vds–Vdsat substantially constant for the tail current transistor, this transistor is prevented from operating in its linear region, which would otherwise cause a decrease in the bandwidth of the amplifier. Second, by keeping (i.e. Vds–Vdsat) is substantially constant for the input transistors, these transistors are prevented from operating in their linear region, which would otherwise cause a reduction in the output impedance and the DC gain of the amplifier. Third, Vds–Vdsat for the input and tail current transistors can be maintained relatively low in order to minimize the reduction of the output swing of the amplifier.

21 Claims, 5 Drawing Sheets

SYSTEM AND METHOD FOR OPTIMAL BIASING OF A TELESCOPIC CASCODE OPERATIONAL TRANSCONDUCTANCE AMPLIFIER (OTA)

FIELD OF THE INVENTION

This invention relates generally to operational amplifiers, and in particular, to a system and method for optimal biasing of a telescopic cascode operational transconductance amplifier (OTA).

BACKGROUND OF THE INVENTION

Telescopic cascode operational transconductance amplifiers (OTAs) have gained wide popularity in the field of integrated circuit design. The reason for its popularity is that telescopic cascode OTAs generally have higher speed to current consumption ratios. That is, telescope cascade OTAs generally require lesser amount of current to achieve a given operational bandwidth as compared to other types of operational amplifiers. One undesirable characteristic of telescope cascade OTAs is that they typically have a relatively small input common mode voltage range, as will be explained in more detail with reference to FIG. 1.

Figure 1:
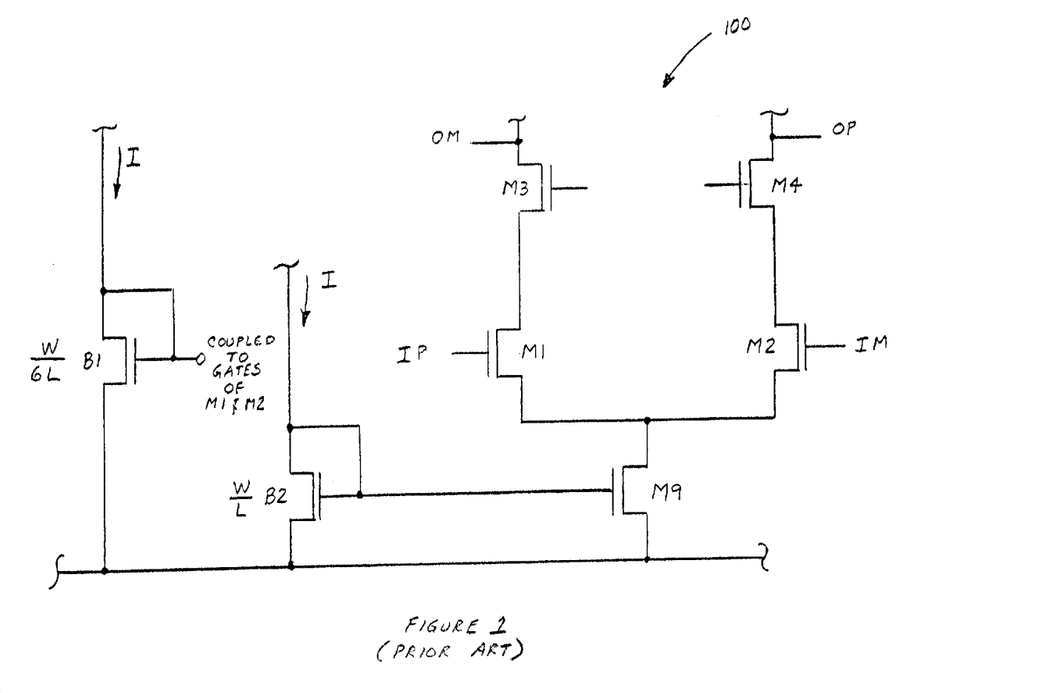
FIG. 1 illustrates a schematic diagram of an exemplary prior art portion of a telescopic cascode OTA.

FIG. 1 illustrates a schematic diagram of an exemplary prior art portion of a telescope cascade OTAs 100. The telescopic cascode OTA 100 consists of positive and negative input NMOS transistors M1 and M2, a tail current NMOS transistor M9, negative and positive output transistors M3 and M4, bias transistor B1 for biasing the gates of input transistors M1 and M2, and bias transistor B2 for biasing the gate of the tail current transistor M9. For this example, assume that the current density for transistors B2, M1, M2 and M9 are substantially the same. That is, these transistors have substantially the same I/(W/L), where I is the drain current, and W and L are respectively the width and length of the transistor channel. Also, assume that the current density for bias transistor B1 is six times that of transistors B2, M1, M2 and M9, i.e. I/(W/6L).

Given these conditions, the voltage provided to the gates of transistors M1 and M2 provided by bias transistor B1 is given by the following equation:

$$Vg(B1) = Vt + \sqrt{\frac{2I}{\mu Cox \frac{W}{6L}}} \qquad \text{Equation 1}$$

where Vt is the device threshold voltage, $\mu$ is the mobility of the device channel, and Cox is the gate capacitance per unit area. The number 6 is a typical scaling factor for the device channel of transistor B1. Accordingly, the drain-to-source voltage (Vds) for the tail current transistor M9 is given by the following equation:

$$Vds(M9) = Vt + \sqrt{\frac{2I}{\mu Cox \frac{W}{6L}}} - Vgs(M1 \text{ or } M2) \qquad \text{Equation 2}$$

The gate-to-source voltage (Vgs) of transistors M1 and M2 is given by the following equation:

$$Vgs(M1 \text{ or } M2) = Vt + \sqrt{\frac{2I}{\mu Cox \frac{W}{L}}} \qquad \text{Equation 3}$$

Combining equations 2 and 3, the drain-to-source voltage (Vds) for the tail current transistor M9 is given by the following relationship:

$$Vds(M9) = (\sqrt{6} - 1) \sqrt{\frac{2I}{\mu Cox \frac{W}{L}}} \qquad \text{Equation 4}$$

The minimum drain-to-source voltage which causes saturation of the drain current designated as Vdsat is given by the following equation:

$$Vdsat(M9) = Vgs - Vt = \sqrt{\frac{2I}{\mu Cox \frac{W}{L}}} \qquad \text{Equation 5}$$

Combining equations 4 and 5, the degree to which the tail current transistor M9 is in saturation is given by Vds−Vdsat, which is given by the following relationship:

$$Vds - Vdsat(M9) = (\sqrt{6} - 2) \sqrt{\frac{2I}{\mu Cox \frac{W}{L}}} \qquad \text{Equation 6}$$

Typically, Vds−Vdsat is set to approximately 100 mVolts for transistor M9 at typical process parameters, room temperature and nominal bias current I.

Equation 6 demonstrates that the degree to which the current tail transistor M9 is in saturation is dependent on several process parameters such as the mobility $\mu$ of the device channel and the gate capacitance per unit area Cox. The mobility $\mu$ of the device channel also strongly depends on temperature. Thus, the degree to which the transistor M9 is in saturation (i.e. Vds−Vdsat) depends not only on process variations but also on temperature variations. For instance, at relatively hot temperatures and slow process corner (typically termed in the art as "slow process corner at hot"), the mobility $\mu$ of the device channel and the gate capacitance per unit area Cox are relatively small. Whereas, at relatively cold temperature and fast process corner (typically termed in the art as "fast process corner at cold"), the mobility $\mu$ of the device channel and the gate capacitance per unit area Cox are relatively large. This process and temperature dependent saturation characteristic Vds−Vdsat also applies to transistors M1 and M2. Further, if the bias current I is also adjustable so that the amplifier bandwidth can be adjusted, the Vds−Vdsat variation is further aggravated.

Because the degree to which transistors M1, M2 and M9 are in saturation is dependent on process and temperature variations, the input common mode voltage range for the telescopic cascode OTA 100 is similarly affected. This presents a problem for the telescopic cascade OTA since it generally has a relatively small input common mode voltage range. If $\Delta V$ is defined as Vds−Vdsat for transistors M1, M2 and M9, then the input common mode range for the telescopic cascode OTA 100 is given by $+/-\Delta V$. For instance, if the amplifier 100 input voltages (IP, IN) drop more than $\Delta V$ due to, for example, switch charge injection and/or clock feedthrough, the tail current transistor M9 would enter the linear region and the tail current is reduced. This has the negative effect of decreasing the operating bandwidth for the amplifier 100. On the other hand, if the amplifier 100 input voltages (IP, IN) rises more than ΔV due to, for example, switch charge injection and/or clock feedthrough, the input transistors M1 and M2 would enter the linear region. This has the negative effects of decreasing the output impedance, the DC gain and accuracy of the amplifier 100.

This problem can be solved by making ΔV=Vds–Vdsat large enough to take into account variations in the input voltages so that transistors M1, M2 and M9 do not enter the linear region under all conditions. However, making ΔV=Vds–Vdsat relatively large has negative consequences. For instance, the higher ΔV=Vds–Vdsat is made, the lower is the output voltage swing of the amplifier 100. Thus, there is a need for a system and method of keeping ΔV=Vds–Vdsat for transistors M1, M2 and M9 relatively constant to prevent the transistors from entering their linear region, and relatively low to minimize the effect on the output swing of the amplifier. Such as system and method is provided herein in accordance with the invention.

SUMMARY OF THE INVENTION

One aspect of the invention includes a system and method of biasing a telescopic cascode operational transconductance amplifier to prevent or reduce the likelihood that the inputs to the amplifier exceed the common mode voltage range for the amplifier. The system and method provides a bias control circuit for the input differential transistors and tail current transistor of the operational amplifier such that their respective Vds–Vdsat is maintained substantially constant. To accomplish this, the biasing system and method uses a bandgap voltage source that typically produces a highly stable voltage that is substantially temperature and process invariant. The bandgap voltage source is used to generate bias voltages applied to the gates and drains of the input differential transistors that maintains their and the tail current transistor's Vds–Vdsat substantially constant.

There are several advantages of the system and method for biasing a telescopic cascade OTA. First, by keeping Vds–Vdsat substantially constant for the tail current transistor, this transistor is prevented from operating in its linear region, which would otherwise cause a decrease in the bandwidth of the amplifier. Second, by keeping (i.e. Vds–Vdsat) substantially constant for the input differential transistors, these transistors are prevented from operating in their linear region, which would otherwise cause a reduction in the output impedance and the DC gain of the amplifier. Third, Vds–Vdsat for the input and tail current transistors can be maintained relatively low in order to minimize the reduction of the output swing of the amplifier.

DETAILED DESCRIPTION OF THE INVENTION

Figure 2:
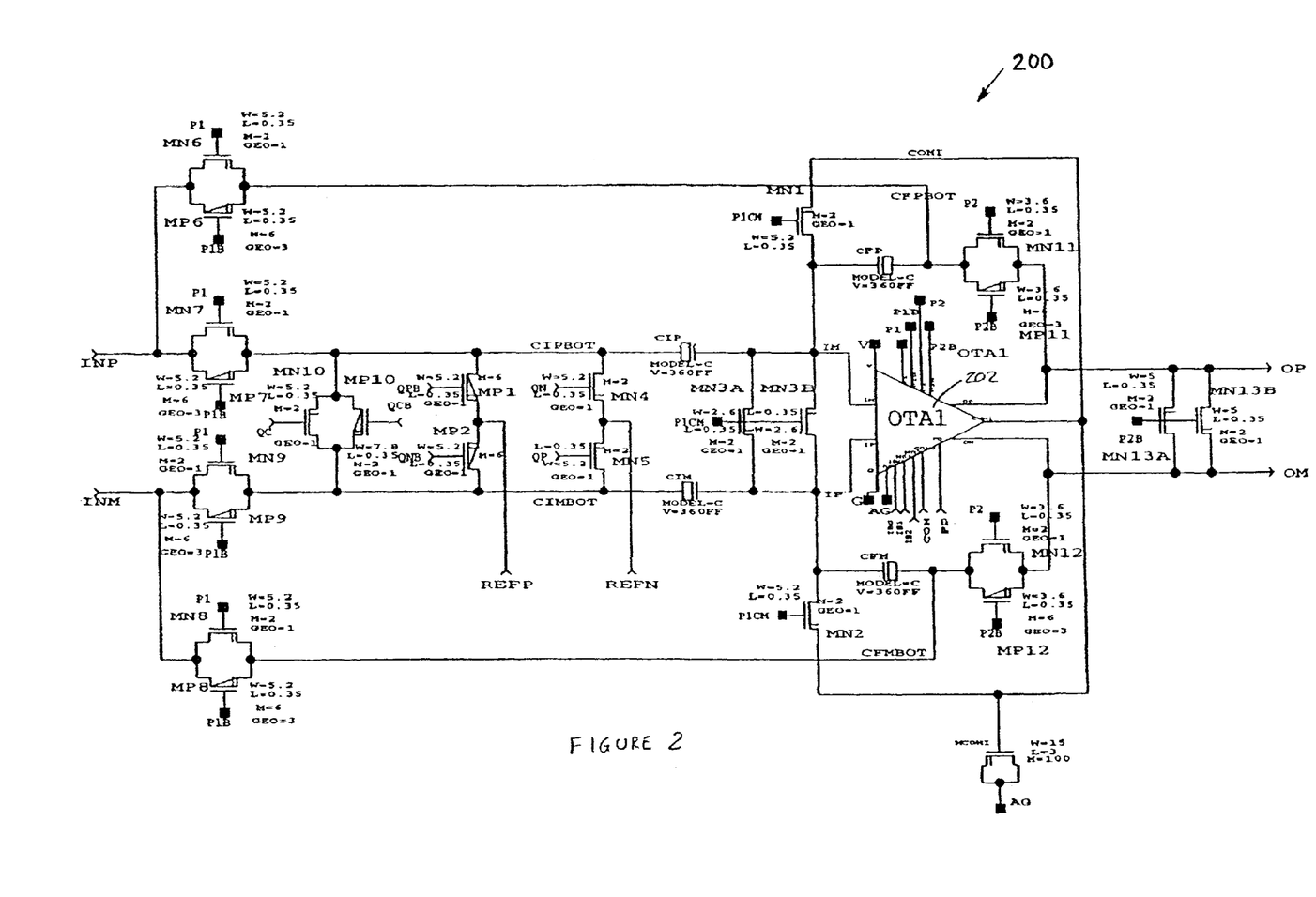
FIG. 2 illustrates a schematic diagram of an exemplary programmable switched-capacitor amplifier using a telescopic cascode OTA in accordance with the invention.

FIG. 2 illustrates a schematic diagram of an exemplary programmable, switched-capacitor amplifier 200 using a telescopic cascode OTA 202 in accordance with the invention. The programmable amplifier 200 has two modes of operations. In a first mode, the voltages at the positive and negative inputs INP and INM are sampled and held. In a second mode, the sampled and held input voltages INP and INM are amplified to produce positive and negative output voltages OP and OM. In the amplification mode, the amplifier 200 can be programmed to provide three different kinds of outputs. These outputs are approximately 2×differential input voltages (INP–INM), 2×input differential voltages (INP–INM)–a reference voltage, and 2×input differential voltages (INP–INM)+the reference voltage, where the reference voltage is given by the difference between reference voltages REFP and REFN shown in the schematic of FIG. 2.

The programmable amplifier 200 is particularly useful when this amplifier is cascaded and the differential inputs INP and INM may vary substantially. For instance, if the differential inputs INP and INM is relatively large and positive, using the nominal gain for amplifier 200 of two (2) may overdrive the subsequent amplifier in the cascaded chain. In this case, the programmable amplifier 200 is programmed to provide an output of 2×input differential voltages (INP–INM)–a reference voltage. On the other hand, if the differential inputs INP and INM is relatively large and negative, the programmable amplifier 200 is programmed to provide an output of 2×input differential voltages (INP–INM)+the reference voltage. If the differential input voltages INP and INM is relatively small (positive or negative), then the programmable amplifier 200 can be programmed to provide a nominal gain of two (2). The programmable amplifier 200 functions as one stage of residual amplifier in a pipeline analog-to-digital converter.

The amplification process of the programmable amplifier 200 operates as follows. First, the programmable amplifier 200 is set to the sampling mode with one phase of a clock signal P1 (P1B meaning the inverted clock signal). In this mode, the clock signal (P1 and P1B) turns on input pass (transmission) gates (MN6, MP6), (MN7, MP7), (MN8, MP8), and (MN9, MP9). This action causes the input positive voltage INP to be applied to capacitors CFP and CIP, and causes the input negative voltage INM to be applied to capacitors CFM and CIM. At the same time, the clock signal P1 also turns on transistors MN1, MN2 and MN3A–3B. Turning on transistors MN3A–3B electrically couples together the positive and negative inputs of the telescopic cascode OTA 202. Turning on transistors MN1 and MN2 causes a voltage COMI generated by telescopic cascode OTA 202 to be applied to the positive and negative inputs of the telescopic cascode OTA 202. As will be explained in more detail later, the voltage COMI is selected to be a desired input common voltage for the telescopic cascade OTA 202. Also, in the sampling phase, the inverted clock cycle P2 (P2B) turns off pass (transmission) gates (MN11, MP11) and (MN12, MP12), and turns on transistors MN13A–13B to clamp the outputs of the telescopic cascode OTA 202.

After the input voltages INP and INM have been sampled and held by capacitors CFP, CIP, CFM and CIM, the programmable amplifier 200 is set to the amplification mode with the opposite phase of clock signal P1, i.e. the phase P2. In this mode, the clock P1 (and P1B) turns off the pass (transmission) gates (MN6, MP6), (MN7, MP7), (MN8, MP8), and (MN9, MP9) so as to substantially isolate the inputs INP and INM from the telescopic cascode OTA 202 during amplification. The clock P1 (and P1B) also turn off transistors MN3A–3B and MN1–2 so that the inputs of the telescopic cascode OTA 202 are not electrically coupled together, and are not coupled to common mode voltage COM1. Additionally, the inverted clock P2 (and P2B) turns on pass (transmission) gates (MN11, MP12) and (MN12, MP12) to provide feedback of the outputs OP and OM to the respective inputs IM and IP for amplification purposes, and turns off transistors MN13A–13B so that the outputs OP and OM are not electrically coupled together.

The three different possible outputs that the programmable amplifier 200 provides are set by pass (transmission) gate (MN10, MP10), transistors MP1–2, and transistors MN4–5. The programmable amplifier 200 has an output of approximately 2×differential input voltages (INP–INM) when the pass (transmission) gate (MN10, MP10) is turned on by signal QC and QCB (i.e. QC inverted), while transistors MP1–2 and MN4–5 are turned off. The programmable amplifier 200 has an output of approximately 2×input differential voltages (INP–INM)–the reference voltage (REFP–REFN) when transistors MP1 and MN5 are turned on respectively by signals QPB (i.e. QP inverted) and QP, while the pass (transmission) gate (MN10, MP10) and transistors MP2 and MN4 are turned off. And, the programmable amplifier 200 has an output of approximately 2×input differential voltages (INP–INM)+the reference voltage (REFP–REFN) when transistors MP2 and MN4 are turned on respectively by signals QNB (i.e. QN inverted) and QN, while the pass (transmission) gate (MN10, MP10) and transistors MP1 and MN5 are turned off. In a pipeline analog-to-digital converter, the signals QC, QCB, QP, QPB, QN, QNB are generated by two comparators looking at the input voltages INP and INM.

The input voltages (IP, IM) to the telescopic cascode OTA 202 may vary beyond the acceptable common mode voltage range during the operation of the programmable amplifier 200 unless compensation measures are taken. During the sampling mode, the input differential voltage to the telescopic cascode OTA 202 does not typically extend beyond the acceptable common mode voltage range since the differential inputs are electrically coupled together by transistors MN3A–3B, and have a voltage COMI applied to them through transistors MN1 and MN2. Since voltage COMI is selected to be a desired input common voltage for the telescopic cascode OTA 202 as explained above, typically no common mode related problems occur during the sampling mode.

However, in the amplification mode, the differential inputs to the telescopic cascode OTA 202 are not as well controlled. More specifically, the differential inputs to the telescopic cascode OTA 202 are subjected to an input circuit that has a relatively high resistance. That is, the negative input to the telescopic cascode OTA 202 looks at the high resistances of transistors MN1, MN3A–3B, and capacitors CFP and CIP. Similarly, the positive input to the telescopic cascode OTA 202 looks at the high resistance of transistors MN2, MN3A–3B, and capacitors CIM and CIM. Thus, in essence, the inputs to the telescopic cascode OTA 202 is nearly floating, without any stable voltage applied which can keep the inputs within the acceptable common mode voltage range. Under these conditions, the common-mode voltage of the inputs to the telescopic cascode OTA 202 may vary, possibly due to switch charge injection and/or clock feedthrough, beyond the acceptable common mode voltage range for the telescopic cascode OTA 202 during the amplification mode of the programmable amplifier 200.

To guarantee a minimum input common mode voltage range under all conditions, the COMI bias voltage and other voltages are selected to produce a $\Delta V = Vds - Vdsat$ for the input transistors M1, M2, and the tail current transistors M9 that is highly stable, and temperature and process insensitive. This $\Delta V = Vds - Vdsat$ for transistors M1, M2 and M9 is around 120 m Volt. The 120 m Volt gives a safe margin because the common mode voltage may vary only by a few tens of mVolt during the amplification mode when voltage COM1 is removed from the inputs.

The COM1 and other bias voltages are derived from bandgap voltage source which produces a relatively high stable voltage that is substantially insensitive to temperature and process variations. This makes $\Delta V = Vds - Vdsat$ for transistors M1, M2 and M9 substantially constant. Since the common mode voltage range is given by $+/-\Delta V$, making $\Delta V = Vds - Vdsat$ substantially constant would prevent the inputs to the telescopic cascode OTA 202 from vary beyond the acceptable common mode voltage range at fast process corner at cold, which would otherwise have a much smaller range with prior art biasing.

Figure 3A:
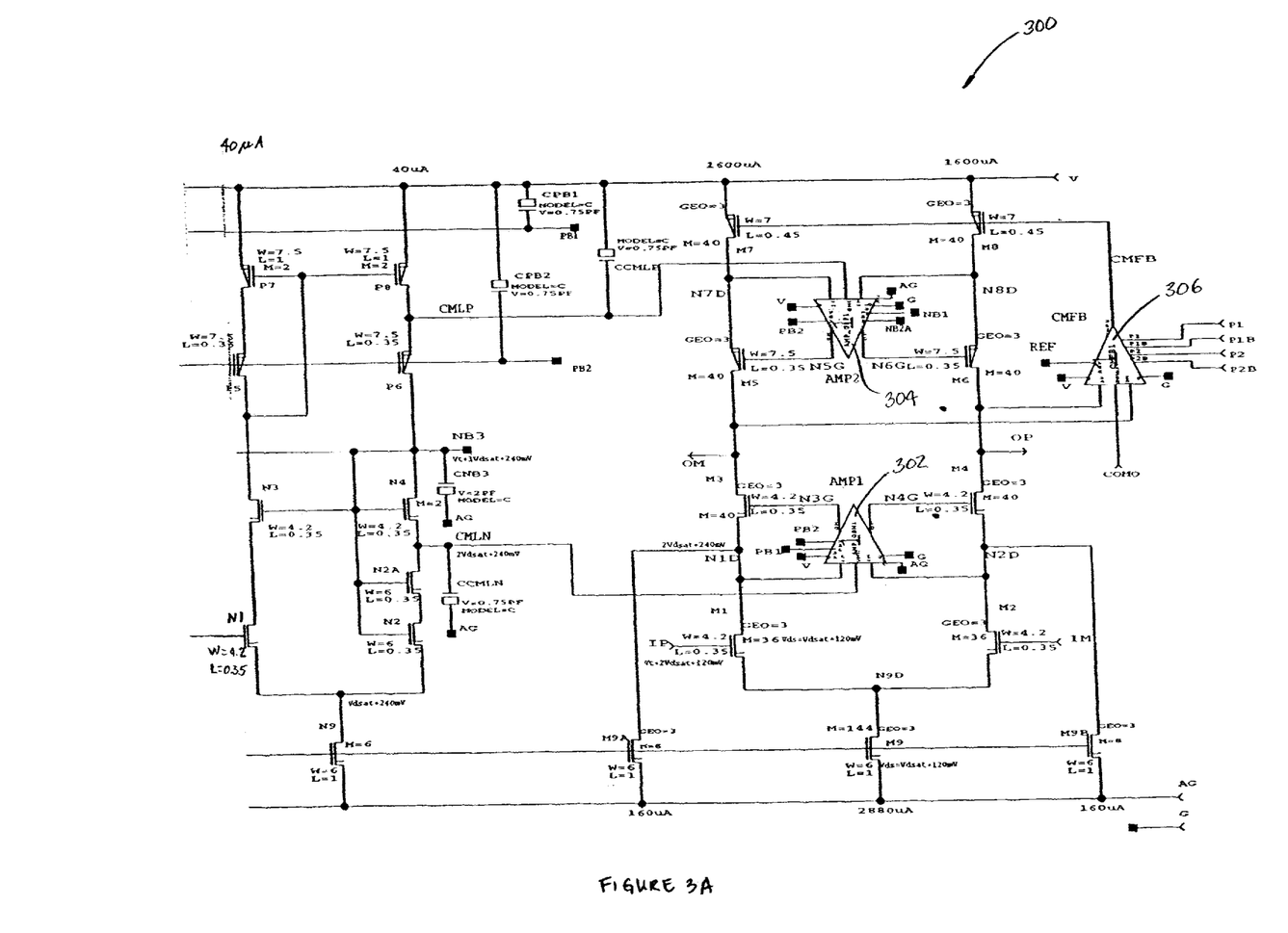
FIGS. 3A–3B illustrate a schematic diagram of an exemplary telescopic cascode OTA in accordance with the invention.
Figure 3B:
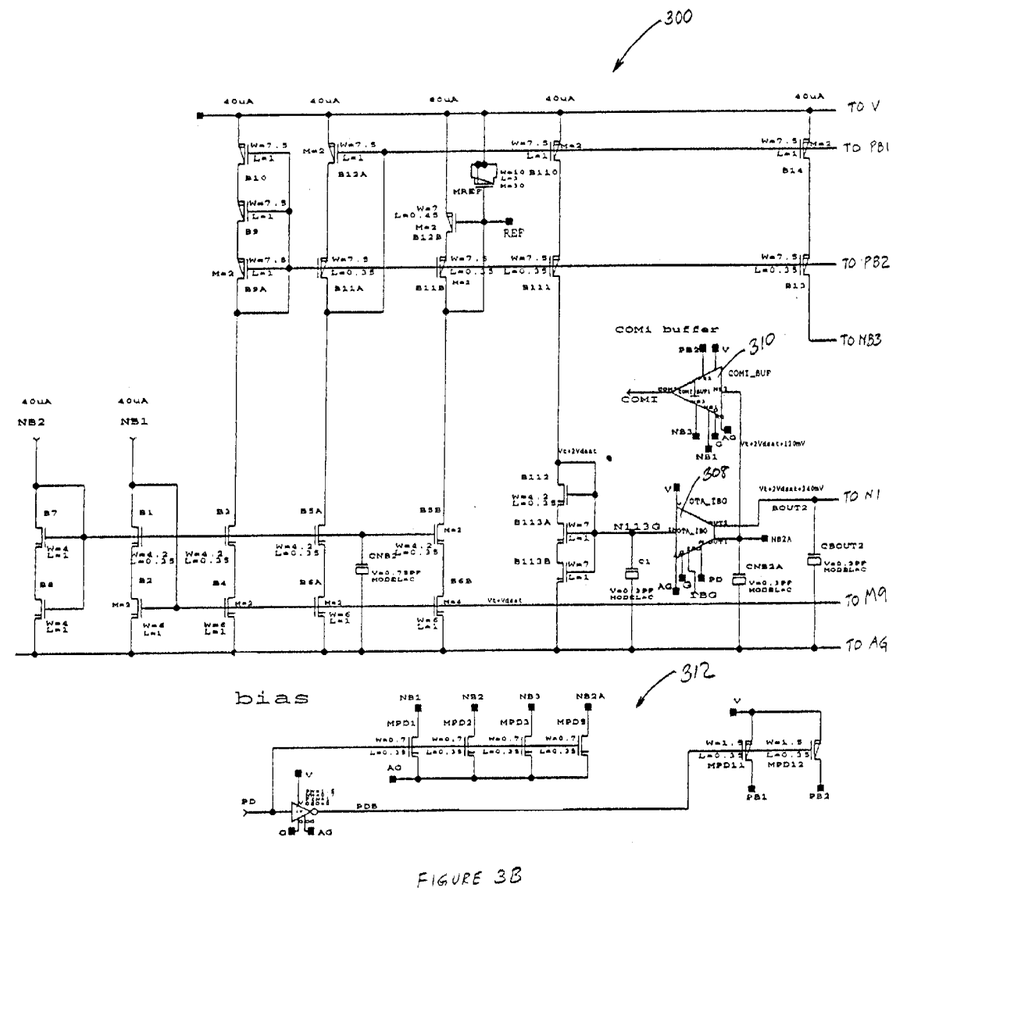

FIGS. 3A–3B illustrate a schematic diagram of an exemplary telescopic cascode OTA 300 in accordance with the invention. The telescopic cascode OTA 300 comprises positive and negative input NMOS transistors M1 and M2, and a tail current transistor M9. An operational amplifier 302, such as a folded cascode amplifier, includes positive and negative inputs coupled to the respective drains of the positive and negative input transistors M1 and M2, and to the respective source of negative and positive output NMOS cascode transistors M3 and M4. The positive and negative outputs of the operational amplifier 302 are coupled to the respective gates of positive and negative output transistors M4 and M3.

The telescopic cascode OTA 300 further includes a second operational amplifier 304, such as another folded cascode amplifier, having positive and negative inputs coupled to respective drains of PMOS transistors M7 and M8, and to respective sources of PMOS transistors M5 and M6. The sources of transistors M7 and M8 are coupled to a supply voltage (v) line. The positive and negative outputs of operational amplifier 304 are coupled to the respective gates of transistors M5 and M6. The positive (OP) and negative (OM) outputs of the exemplary telescopic cascode OTA 300 are coupled to the respective drains of transistors M5 and M6, and to the respective drains of transistors M3 and M4. The operational amplifier 304 further includes a third input to receive a voltage CMLP which is used to set the drain voltages of transistors M7 and M8, such that both of them are in saturation. The two operational amplifiers 302 and 304 boost the DC gain of the main telescopic cascode OTA 300, such that it will have very high accuracy.

The telescopic cascode OTA 300 further includes a dynamic common-mode feedback block 306 having positive and negative inputs coupled respectively to the positive (OP) and negative (OM) outputs of the telescopic cascode OTA 300. The output of the feedback block 306 is coupled to the gates of transistors M7 and M8. The feedback block 306 controls the common-mode voltage of the OP and OM outputs, which is set to be around the voltage COMO.

The control of the input common mode voltage range for the input transistors M1 and M2, and tail current transistor M9 will now be explained. Referring to FIG. 3B, the NMOS transistor B2 is biased to produce a gate-to-source voltage Vt+Vdsat. Since the gate voltage of bias transistor B2 is electrically coupled to the gate of the tail current transistor M9, its gate voltage is also Vt+Vdsat. Thus, the tail current transistor M9 has substantially the same saturation voltage Vdsat as bias transistor B2. Bias transistors B112, B113A and B113B have the same drain current as bias transistor B2.

However, bias transistors B112, B113A and B113B in combination are designed to have an effective current density of I/(W/4L), four (4) times the current density I/(W/L) of transistor B2. Thus, bias transistors B112, B113A, and B113B have a saturation voltage that is twice the saturation voltage for transistor B2, i.e. 2Vdsat. Thus, the gate-to-source voltage of the combined transistors B112, B113A and B113B is Vt+2Vdsat. This voltage is applied to the input of an offset voltage source 308.

As will be explained in more detail later with reference to FIG. 4, the offset voltage source 308 produces two outputs that are offset from the input voltage. In this case, the voltage source 308 produces a first output (OUT1) being 120 mVolts above the input voltage and a second output voltage (OUT2) that is 240 mVolts above the input voltage. Since in this example, the input voltage to the offset voltage source 308 is Vt+2Vdsat, the first output voltage (OUT1) is Vt+2Vdsat+120 mVolt, and the second output voltage (OUT2) is Vt+2Vdsat+240 mVolt. The offset voltages 120 mVolt and 240 mVolt are both derived from a bandgap voltage source that produces a substantially stable, substantially temperature invariant, and substantially process invarient current IBG. In the voltage source 308, the highly stable current IBG is passed through two resistive elements to produce the 120 mVolt and 240 mVolt offsets.

The first output voltage (OUT1) of the voltage source 308 is applied to buffer amplifier 310 to generate voltage COMI. The voltage COMI is applied to the gates of the input transistors M1 and M2 during the sampling phase of the programmable amplifier 200. Since the COMI voltage is equal to Vt+2Vdsat+120 mVolt, and the gate-to-source voltage of the input transistors M1 and M2 is equal to Vt+Vdsat, then the drain-to-source voltage of the tail current transistor M9 is:

$$Vds(M9)=Vt+2Vdsat+120 \text{ mVolt}-(Vt+Vdsat)=Vdsat+120 \text{ mVolt} \quad \text{Equation 7}$$

Thus, the extent into which the tail current transistor M9 is in saturation, which is given by the relationship Vds−Vdsat, is:

$$Vds(M9)-Vdsat=Vdsat+120 \text{ mVolt}-Vdsat=120 \text{ mVolt} \quad \text{Equation 8}$$

Equation 8 demonstrates that the extent into which the tail current transistor M9 is in saturation is given by the offset voltage produced by offset voltage source 308. As it was previously explained, the offset voltage is derived from a bandgap voltage source which is highly stable, and substantially temperature and process invarient. Thus, the system and method of biasing the input transistors M1 and M2 and the tail current transistor M9 maintains the transistor M9 in its saturation region with a well-controlled margin, and keeps it from going into its linear region where adverse effects to the telescopic cascode OTA 300 occurs.

The second output voltage (OUT2) of the voltage source 308 is applied to the gate of NMOS transistor N1. The gate-to-source voltage for transistor N1 is given by Vt+Vdsat, since this transistor has the same current density as transistor B2. Thus, the drain-to-source voltage of transistor N9 is given by the following equation:

$$Vds(N9)=V(\text{OUT2})-Vgs(N1)=Vt+2Vdsat+240 \text{ mVolt}-(Vt+Vdsat)=Vdsat+240 \text{ mVolt} \quad \text{Equation 9}$$

The combined transistors N4, N2A, and N2 is designed to have a current density of 4 times that of the current density of transistor B2. Thus, the gate-to-source voltage for the combined transistors N4, N2A, and N2 is Vt+2Vdsat. Thus, the absolute gate voltages of transistors N4, N2A and N2 is then the drain voltage of transistor N9 plus the gate-to-source voltage of the combined transistor N4, N2A and N2 which is given by the following relationship:

$$Vg(N4, N2A, N2)=Vgs(N4, N2A, N2)+Vds(N9)=Vt+2Vdsat+Vdsat+240 \text{ mVolt}=Vt+3Vdsat+240 \text{ mVolt} \quad \text{Equation 10}$$

The gate-to-source voltage of individual transistor N4, however, is again Vt+Vdsat, since it has substantially the same current density as transitor B2. Thus, the absolute voltage at the source of transistor N4 designated as CMLN is given by the following relationship:

$$CMLN=Vg(N4, N2A, N2)-Vgs(N4)=Vt+3Vdsat+240 \text{ mVolt}-(Vt+Vdsat)=2Vdsat+240 \text{ mVolt} \quad \text{Equation 11}$$

The CMLN voltage is applied to the third input of operational amplifier 302, which causes the drain voltages of the input transistors M1 and M2 to be equal to CMLN.

The extent to which the input transistors M1 and M2 are in saturation is given by the equation Vds−Vdsat. The drain-to-source voltage of the input transistors M1 and M2 is the voltage CMLM minus the drain-to-source voltage of the tail current transistor M9. Thus, the drain-to-source voltage for the input transistors M1 and M2 is given by the following relationship:

$$Vds(M1, M2)=CMLN-Vds(M9)=2Vdsat+240 \text{ mVolt}-(Vdsat+120 \text{ mVolt})=Vdsat+120 \text{ mVolt} \quad \text{Equation 12}$$

Therefore, the extent to which the input transistors M1 and M2 are in saturation is given by:

$$Vds(M1,M2)-Vdsat=Vdsat+120 \text{ mVolt}-Vdsat=120 \text{ mVolt} \quad \text{Equation 13}$$

Equation 13 demonstrates that the extent into which the input transistors M1 and M2 is in saturation is given by the difference between the offset voltages produced by the offset voltage source 308. As it was previously explained, the offset voltages are derived from a bandgap voltage source which is highly stable, and substantially temperature and process invarient. Thus, the system and method of biasing the input transistors M1 and M2 and the tail current transistor M9 maintains the input transistor M1 and M2 in its saturation region with a well-controlled margin, and keeps it from going into its linear region where adverse effects to the telescopic cascode OTA 300 occurs.

There are several advantages of the system and method for biasing a telescopic cascode OTA in accordance with the invention. First, the extent to which the tail current transistor is in saturation (i.e. Vds−Vdsat) is maintained substantially constant, regardless of substantial temperature, process, and bias current variation. Thus, the tail current transistor is prevented from operating in its linear region which reduces the bandwidth of the amplifier (even with fast process corner at cold and low bias current). Second, the extent to which the input transistors is in saturation (i.e. Vds−Vdsat) is also maintained substantially constant, regardless of substantial temperature, process, and bias current variation. Thus, the input transistors are prevented from operating in its linear region, which reduces the output impedance the amplifier as well as the DC gain and the accuracy, even with fast process at cold and low bias current. Third, the extent to which the input and tail current transistors is in saturation (i.e. Vds−Vdsat) can be maintained relatively low in order to minimize the reduction of the output swing of the amplifier due to the drain-to-source voltage drops of these transistors, even with slow process corner at hot and high bias current.

The remaining circuitry of the telescopic cascode OTA 300 is standard. For example, the telescopic cascode OTA 300 includes a power down circuit 312 for turning off the amplifier. Also, the telescopic cascode OTA 300 includes circuitry for generating the bias voltages PB1, PB2, and REF. The OUT1 voltage produced by the offset voltage source 308 is also applied to the upper folded cascode amplifier 304 to insure that Vds−Vdsat for output current source devices of amplifier 304 remain substantially constant, in a similar manner as transistor M9 of the telescopic cascode OTA 300 remains substantially constant. This is done to prevent a reduction of the output swing of the telescopic cascode OTA 304 during slow process corner at hot condition.

Figure 4:
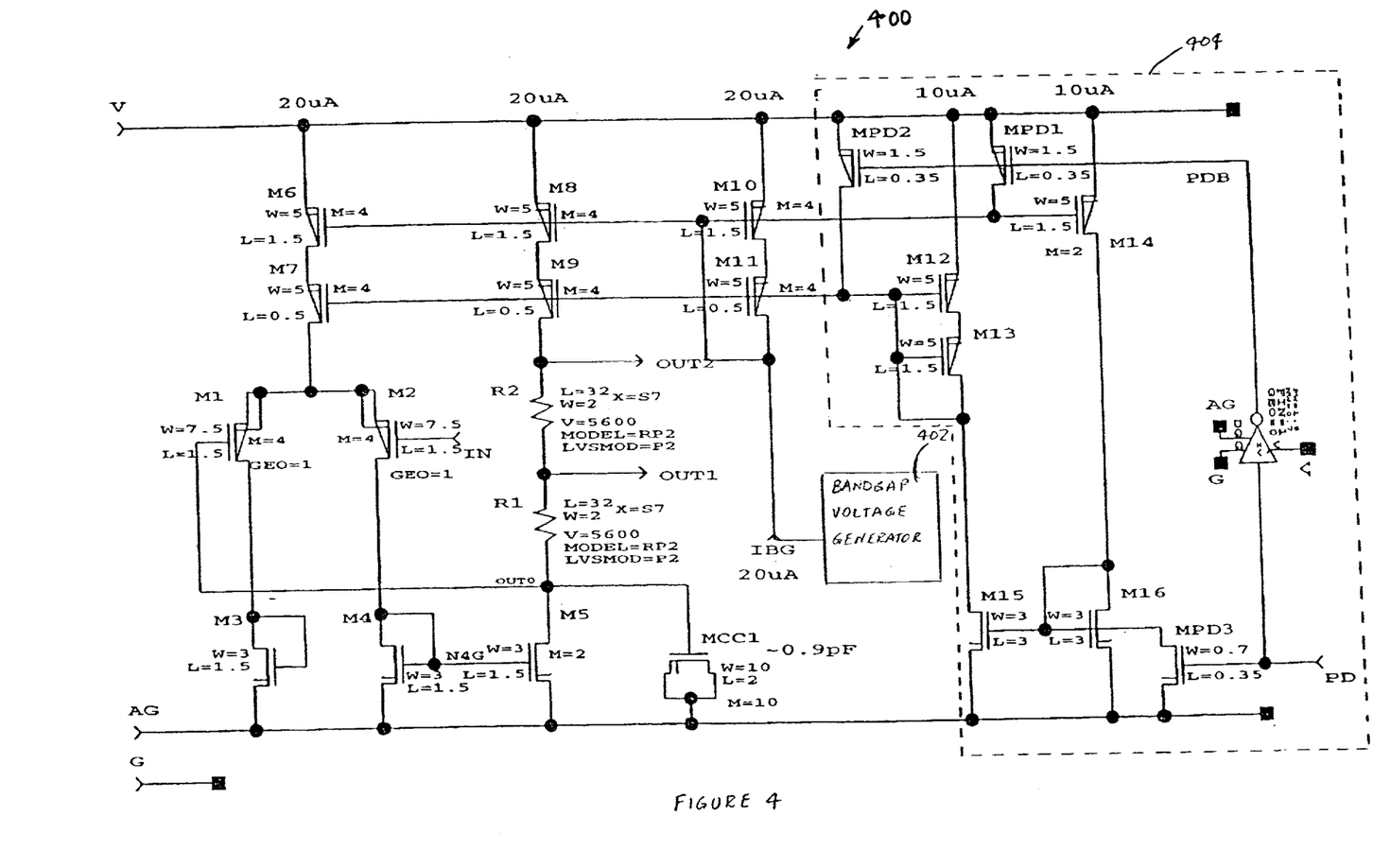
FIG. 4 illustrates a schematic diagram of an exemplary highly stable, and substantially temperature and process invariant offset voltage source in accordance with the invention.

FIG. 4 illustrates a schematic diagram of an exemplary offset voltage source 400 for biasing a telescopic cascode OTA in order to maintain a substantially constant Vds−Vdsat for the input transistors M1 and M2 and tail current transistor M9. The voltage source 400 receives a highly stable current IBG generated by a standard bandgap voltage generator 402. The bandgap voltage generator produces a voltage VBG that is highly stable, and substantially temperature and process invariant. The bandgap voltage generator has an internal resistance R, and thus produces a substantially constant current IBG being equal to VBG/R. The highly stable current IBG is applied to PMOS transistors M10 and M11 to mirror the highly stable current IBG to the series paths including PMOS transistors M8–M9 and PMOS transistors M6–M7.

Being that the highly stable current IBG is mirrored onto the series path including transistors M8 and M9, the current IBG produces highly stable voltage drops across resistors R1 and R2. The input to the voltage source is applied to the gate of PMOS transitor M2. Because the drain current must be substantially equal through transistors M1 and M2, the gate voltage of transistor M1 obtains the input voltage applied to the gate of transistor M2. The lower offset voltage (OUT1) produced by the voltage source 400 is thus the input voltage plus the highly stable voltage drop across resistor R1. And, the higher offset voltage (OUT2) produced by the voltage source 400 is thus the input voltage plus the highly stable voltage drops across resistors R1 and R2. The voltage source 400 further includes a power down circuit 404 for turning off the voltage source circuitry.

In the foregoing specification, the invention has been described with reference to specific embodiments thereof. It will, however, be evident that various modifications and changes may be made thereto departing from the broader spirit and scope of the invention. The specification and drawings are, accordingly, to be regarded in an illustrative rather than a restrictive sense. For instance, the system and method biasing the telescopic cascode OTA to achieve a substantially constant Vds−Vdsat for the input transistors and the tail current transistor is applicable to other types of operational amplifiers.

What is claimed is:

1. A method of biasing an operational amplifier having differential input field effect transistors and a tail current field effect transistor, comprising:

using a band gap voltage source to bias said differential input field effect transistors in a manner that a difference between a drain-to-source voltage (Vds) and a saturation voltage (Vdsat) for each of said differential input field effect transistors is maintained substantially constant; and using said band gap voltage source to bias said tail current transistor in a manner that a difference between a drain-to-source voltage (Vds) and a saturation voltage (Vdsat) for said tail current transistor is maintained substantially constant.

2. The method of claim 1, comprising using a first bias transistor to establish said saturation voltage (Vdsat) for said current tail field effect transistor.

3. The method of claim 2, comprising using a second bias transistor to form a first intermediate bias voltage being substantially twice said saturation voltage (Vdsat) of said tail current field effect transistor plus a threshold voltage (Vt).

4. The method of claim 3, comprising offsetting said intermediate bias voltage by a first offset voltage derived from said band gap voltage to form gate bias voltages for respective differential input field effect transistors, wherein said first offset voltage indicates an extent to which said tail current field effect transistor is in saturation.

5. The method of claim 4, comprising offsetting said intermediate bias voltage by a second offset voltage derived from said band gap voltage source to form a second intermediate voltage being substantially twice said saturation voltage (Vdsat) of said tail current field effect transistor plus said threshold voltage plus said second offset voltage.

6. The method of claim 5, comprising applying said second intermediate voltage to a gate of a third bias transistor having substantially the same saturation voltage (Vdsat) of said tail current field effect transistor to form a third intermediate voltage being substantially said saturation voltage (Vdsat) of said tail current field effect transistor plus said second offset voltage.

7. The method of claim 6, comprising applying said third intermediate voltage to a source of a fourth bias transistor to form drain bias voltages for respective differential input field effect transistors substantially being twice said saturation voltage (Vdsat) of said tail current field effect transistor plus said second offset voltage, wherein a difference between said second and first offset voltages indicate an extent to which said differential field effect transistors are in saturation.

8. An operational amplifier, comprising:

differential input field effect transistors;

a tail current field effect transistor; and a bias circuit for biasing said differential input field effect transistors and said tail current transistor in a manner that a difference between a drain-to-source voltage (Vds) and a saturation voltage (Vdsat) for each of said differential input field effect transistors is maintained substantially constant, and in a manner that a difference between a drain-to-source voltage (Vds) and a saturation voltage (Vdsat) for said tail current transistor is maintained substantially constant.

9. The operational amplifier of claim 8, wherein said bias circuit comprises a first bias transistor for establishing said saturation voltage (Vdsat) for said current tail field effect transistor.

10. The operational amplifier claim 9, wherein said bias circuit further includes a second bias transistor for forming a first intermediate bias voltage being substantially twice said saturation voltage (Vdsat) of said tail current field effect transistor plus a threshold voltage (Vt).

11. The operational amplifier of claim 10, wherein said bias circuit further includes an offset circuit for offsetting said intermediate bias voltage by a first offset voltage derived from a band gap voltage source to form gate bias voltages for respective differential input field effect transistors, wherein said first offset voltage indicates an extent to which said tail current field effect transistor is in saturation.

12. The operational amplifier method of claim 11, wherein said offset circuit is capable of offsetting said intermediate bias voltage by a second offset voltage derived from said band gap voltage source to form a second intermediate voltage being substantially twice said saturation voltage (Vdsat) of said tail current field effect transistor plus said threshold voltage plus said second offset voltage.

13. The operational amplifier of claim 12, wherein said bias circuit includes a third bias transistor including a gate for receiving said second intermediate voltage, wherein said third bias transistor is biased to have substantially the same saturation voltage (Vdsat) of said tail current field effect transistor to form a third intermediate voltage being substantially said saturation voltage (Vdsat) of said tail current field effect transistor plus said second offset voltage.

14. The operational amplifier of claim 13, wherein said bias circuit includes a fourth transistor having a source for receiving said third intermediate voltage to form drain bias voltages for respective differential input field effect transistors substantially being twice said saturation voltage (Vdsat) of said tail current field effect transistor plus said second offset voltage, wherein a difference between said second and first offset voltages indicate an extent to which said differential field effect transistors are in saturation.

15. A telescopic cascode OTA, comprising:
   differential input field effect transistors;
   a tail current field effect transistor; and
   a bias circuit for biasing said differential input field effect transistors and said tail current transistor in a manner that a difference between a drain-to-source voltage (Vds) and a saturation voltage (Vdsat) for each of said differential input field effect transistors is maintained substantially constant, and in a manner that a difference between a drain-to-source voltage (Vds) and a saturation voltage (Vdsat) for said tail current transistor is maintained substantially constant.

16. The telescopic cascode OTA of claim 15, wherein said bias circuit comprises a first bias transistor for establishing said saturation voltage (Vdsat) for said current tail field effect transistor.

17. The telescopic cascode OTA claim 16, wherein said bias circuit further includes a second bias transistor for forming a first intermediate bias voltage being substantially twice said saturation voltage (Vdsat) of said tail current field effect transistor plus a threshold voltage (Vt).

18. The telescopic cascode OTA of claim 17, wherein said bias circuit further includes an offset circuit for offsetting said intermediate bias voltage by a first offset voltage derived from a band gap voltage source to form gate bias voltages for respective differential input field effect transistors, wherein said first offset voltage indicates an extent to which said tail current field effect transistor is in saturation.

19. The telescopic cascode OTA method of claim 18, wherein said offset circuit is capable of offsetting said intermediate bias voltage by a second offset voltage derived from said band gap voltage source to form a second intermediate voltage being substantially twice said saturation voltage (Vdsat) of said tail current field effect transistor plus said threshold voltage plus said second offset voltage.

20. The telescopic cascode OTA of claim 19, wherein said bias circuit includes a third bias transistor including a gate for receiving said second intermediate voltage, wherein said third bias transistor is biased to have substantially the same saturation voltage (Vdsat) of said tail current field effect transistor to form a third intermediate voltage being substantially said saturation voltage (Vdsat) of said tail current field effect transistor plus said second offset voltage.

21. The telescopic cascode OTA of claim 20, wherein said bias circuit includes a fourth transistor having a source for receiving said third intermediate voltage to form drain bias voltages for respective differential input field effect transistors substantially being twice said saturation voltage (Vdsat) of said tail current field effect transistor plus said second offset voltage, wherein a difference between said second and first offset voltages indicate an extent to which said differential field effect transistors are in saturation.

* * * * *